Jan. 7, 1969 CHARLES C. Y. KUO 3,420,706

TECHNIQUE FOR FABRICATION OF PRINTED CIRCUIT RESISTORS

Filed June 23, 1964

INVENTOR
C. C. Y. KUO
BY Edward M. Fink
ATTORNEY

United States Patent Office
3,420,706
Patented Jan. 7, 1969

3,420,706
TECHNIQUE FOR FABRICATION OF PRINTED CIRCUIT RESISTORS

Charles C. Y. Kuo, Bethlehem, Pa., assignor to Bell Telephone Laboratories, Incorporated, New York, N.Y., a corporation of New York Filed June 23, 1964, Ser. No. 377,303
U.S. Cl. 117—227 4 Claims
Int. Cl. B44d *1/20;* C23c *11/00*

ABSTRACT OF THE DISCLOSURE

Thermal trimming of thin film resistor is effected by heating the films to a temperature within the range of 400–650° C. in an oxidizing atmosphere.

Figure 1:
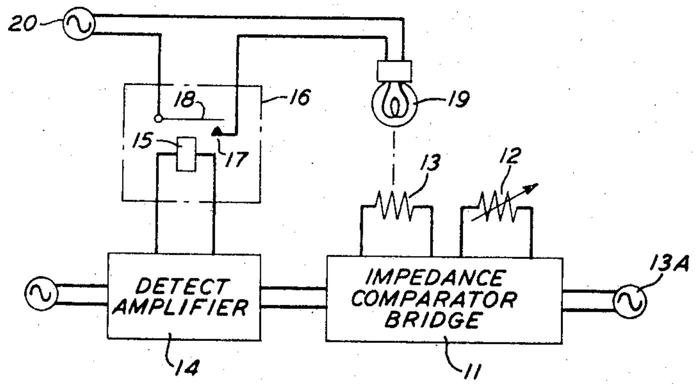

This invention relates to a technique for the fabrication of stabilized metal film resistors.

In recent years, a widely used method for reducing the size of electrical apparatus has been the substitution of printed circuits for conventional wiring. Accordingly, a need has been created for precise and accurate procedures for the fabrication of printed circuit components such as resistors.

The earliest printed circuit resistors consisted of an array of parallel lines which were connected at alternate ends to form a continuous path, the configuration also including "shorting bars" which served to connect alternate lines, thereby shorting out the resistance of the line intermediate the two connected lines. Such resistors were designed to have a resistance lower than the desired value and adjustment was made by cutting through an appropriate number of shorting bars.

The next step in the development of printed circuit resistors is described in copending application, Ser. No. 845,754, filed Oct. 12, 1959, and now Patent No. 3,148,129 wherein a film-forming metal is deposited upon a substrate in a configuration such that the resistance of the deposited layer is less than that ultimately desired. Subsequently, the deposited layer is anodized to convert a portion of the metal layer thickness to the oxide form, thereby increasing the resistance of the layer, anodization being continued until the resistance of the metal layer attains a desired value as indicated by a monitoring means.

Although devices fabricated in accordance with the techniques described heretofore had proven satisfactory in most applications, resistance drift had been noted. In order to avoid such difficulty, a technique was described in copending application, Ser. No. 74,691, filed Dec. 8, 1960, now Patent No. 3,159,556, wherein a thermal oxidation technique was appended to the procedure described in the abovenoted copending application. Thus, this technique includes the procedural steps described (in Ser. No. 845,754), and, in addition, sets forth an air oxidation step conducted at elevated temperatures subsequent to anodization, so resulting in the enhancement of stability.

In accordance with the present invention, a technique is described for the fabrication of precision stabilized metal film resistors wherein the prior art procedural steps of anodization and thermal stabilization are replaced by a solitary step of thermal trimming. The inventive technique involves depositing a film-forming metal on a substrate in a configuration such that the resistance of the deposited layer is less than that ultimately desired and, subsequently, heating the resultant film to a temperature within the range of 400–650° C. in an oxidizing atmosphere for a time period within the range of 30 seconds to 5 hours, thereby oxidizing the film and increasing its effective resistance. Heating is continued until the resistance equals the desired value as indicated by a monitoring means.

The invention has been described largely in terms of tantalum film resistors obtained by cathodic sputtering techniques. However, it will be understood that the inventive technique is applicable in the adjustment to value of oxidizable film notwithstanding the composition or manner of preparation, and is not to be construed as being restricted to a specific film or method of production.

Figure 2:
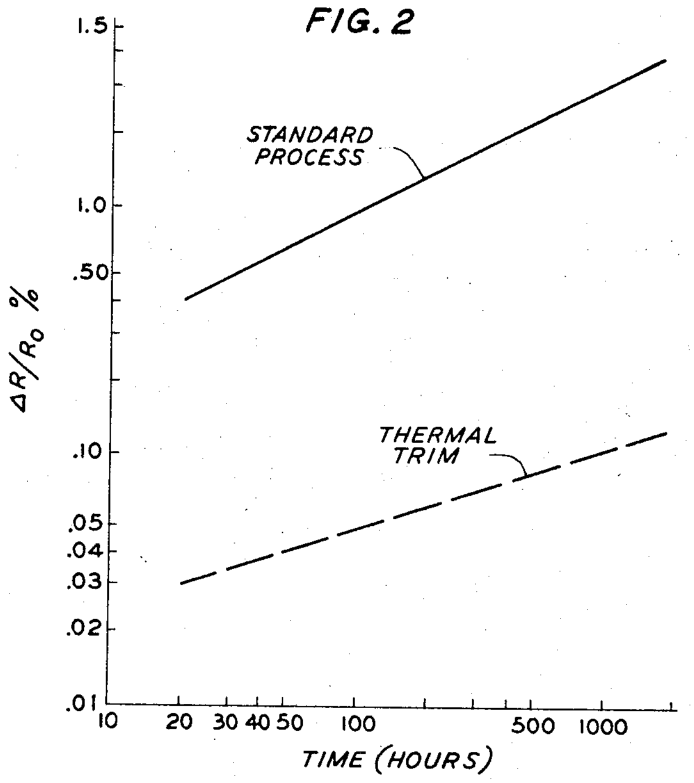

The invention will be more readily understood from the following detailed description taken in conjunction with the accompanying drawing wherein:

FIG. 1 is a schematic diagram of an exemplary circuit useful in the practice of the present invention; and FIG. 2 is a graphical representation on log-log paper on coordinates of time in hours against percentage change in resistance showing a comparison of resistance stability between prior art devices and those fabricated in accordance with the present inventive technique.

With reference now more particularly to FIG. 1, there is shown a comparator bridge 11 including as legs thereof a fixed resistance 12 and resistor 13 which it is desired to adjust to the resistive value of resistance 12. Bridge 11 is connected to a source of alternating current 13A and amplifier 14 including solenoid 15. The circuit is completed by magnetic latching switch 16 including contacts 17 and 18, heat source 19 and a source of current 20 for actuating heat source 19.

In the operation of the process, a resistive element prepared in accordance with any of the conventional prior art techniques serves as resistor 13 in comparator bridge 11, resistance 12 being selected so as to have a value equivalent to that desired in resistor 13. Resistor 13 is then irradiated by heat source 19 and while there continues to be a difference in resistive value between elements 12 and 13 current passes through amplifier 14, so creating a magnetic field in solenoid 15 which in turn causes closing of latching switch 16. After adjusting resistor 13 to the desired value, current ceases to pass through amplifier 14, thereby breaking the circuit and terminating the process.

It has been determined that stabilization and adjustment to value of resistive films of the type described may be attained by a high temperature thermal treatment which comprises heating the film by means of an external source or by Joule heating, so eliminating the conventional wet anodization procedures. The thermal treatment is conducted at a temperature within the range of 400–650° C., a heat shield being desirably employed to maintain the direct heat upon the resistor pattern rather than upon the terminations. Operation at temperatures less than the noted minimum is impractical whereas operation at themperatures appreciably beyond the noted maximum results in destruction of the resistor.

The source of the heat is not critical and may be a flame, infrared radiation, heated air or current pulses. During the heating step any suitable monitoring means, as, for example, a bridge impedance comparator, is connected to the resistive film.

An example of the present invention is described in detail below. The example and the illustration described above is included merely to aid in the understanding of the invention, and variations may be made by one skilled in the art without departing from the spiirt and scope of the invention.

EXAMPLE

This example describes the fabrication of ten tantalum nitride resistors in accordance with the present inventive technique.

A conventional sputtering apparatus was used to produce the tantalum nitride layer. The cathode consisted of a square tantalum sheet 50 mils thick and 12 inches on a side of high purity. In the apparatus actually employed, the anode was grounded, the potential difference being obtained by making the cathode negative with respect to ground.

A glass microscope slide, approximately 1 inch in width and 3 inches in length was used as a substrate. Gold terminals 0.1 inch by 0.1 inch were silk screened on each longitudinal side of the substrate and fired at above 600° C. The terminated slides were then cleansed using the following procedure. The slides were first washed in a detergent to remove large particles of dirt and grease. Next, there followed a tap water rinse, a ten minute boil in a 10 percent hydrogen peroxide solution, a distilled water rinse, a ten minute boil in distilled water, and storage in an oven maintained at 150° C. until ready for use.

The vacuum chamber was evacuated by means of an oil diffusion pump to a pressure of approximately $10_{-6}$ mm. of mercury after a time period within the range of 15 to 30 minutes. Next, the substrate was heated to a temperature of approximately 400° C. After obtaining such temperature, nitrogen was admitted into the chamber at a dynamic pressure, and after obtaining equilibrium, argon was admitted into the chamber at a pressure of 30 microns. During the sputtering reaction, a shield was used to protect the terminations and the partial pressure of nitrogen was maintained at approximately $3\times10_{-4}$ torr.

The anode and cathode were spaced approximately 2.5 inches apart, the cleansed substrate being placed therebetween, D-C voltage of 5000 volts being impressed between cathode and anode.

Sputtering was conducted for approximately 10 minutes, yielding a tantalum nitride layer of approximately 1500 Angstroms. Following the sputtering treatment, the resultant films were thermally trimmed by heating to about 500° C. with a concentrated infrared heat lamp (in a circuit of the type shown in FIG. 1) until the resistance increased to a predetermined value as indicated by a monitoring means. Finally, the resultant resistors were put on load life test at one watt D-C power dissipation, and room ambient temperature for life test studies, the results of which are discussed below. The initial tolerance can be easily adjusted to within 0.2 percent of some predetermined value, and by using lower temperatures as well as a more precise monitoring device, 0.1 percent and less may be attained.

With further reference now to FIG. 2 there is shown a graphical representation on log-log paper on coordinates of time in hours against percentage change in resistance showing a comparison of resistance stability between prior art devices and those fabricated as described in the example. The prior art devices were prepared by sputtering tantalum nitride films as outlined above, anodizing to >30 volts in dilute citric acid, thermally stabilizing at 250° C. for 5 hours and adjusting to value by further anodization. It is to be noted that the variation in resistance for continuous load aging at 1 watt D-C for the prior art devices ranges from 0.5 to 2 percent over a time period of 1000 hours, whereas devices fabricated in accordance with the inventive technique evidence resistance drift ranging from 0.03 to 0.1 percent over a time period of 1000 hours.

While the invention has been described in detail in the foregoing specification and the drawing similarly illustrates the same, the aforesaid is by way of illustration only and is not restrictive in character. The several modifications which will readily suggest themselves to persons skilled in the art are all considered within the scope of this invention, reference being had to the appended claims.

What is claimed is:

1. A method for the fabrication of a stabilized metal film resistor having a predetermined resistance value which comprises the steps of depositing a layer of a film-forming metal on a substrate in a configuration such that the resistance of said layer is less than that desired, heating the said layer to a temperature within the range of 400–650° C. whereby the conductivity of said layer is reduced and continuing said heating until the resistance of said layer attains the desired value as indicated by a monitoring means.

2. A method in accordance with the procedure of claim 1 wherein said film-forming metal is tantalum.

3. A method in accordance with the procedure of claim 1 wherein said metal film is tantalum nitride.

4. A method in accordance with the procedure of claim 1 wherein said temperature is 500° C.

References Cited

UNITED STATES PATENTS

| | | | |
|---|---|---|---|
| 3,148,129 | 9/1964 | Basseches et al. | 204—38 |
| 3,159,556 | 12/1964 | McLean et al. | 204—37 |
| 3,218,194 | 11/1965 | Maissel | 117—62 X |
| 3,220,889 | 11/1965 | Walker | 148—6.3 |
| 3,056,937 | 10/1962 | Pritikin | 117—212 X |
| 3,167,451 | 1/1965 | Tierman | 117—227 |
| 3,189,482 | 6/1965 | Bajars et al. | 117—227 |

WILLIAM L. JARVIS, *Primary Examiner.*

U.S. Cl. X.R.

117—62: 148—6.3; 204—38; 338—308